United States Patent
Ramin et al.

(10) Patent No.: US 7,629,212 B2
(45) Date of Patent: Dec. 8, 2009

(54) DOPED WGE TO FORM DUAL METAL GATES

(75) Inventors: Manfred Ramin, Austin, TX (US); Mark R. Visokay, Richardson, TX (US); Michael Francis Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 358 days.

(21) Appl. No.: 11/725,291

(22) Filed: Mar. 19, 2007

(65) Prior Publication Data
US 2008/0274598 A1 Nov. 6, 2008

(51) Int. Cl.
*H01L 21/8238* (2006.01)
(52) U.S. Cl. .............. 438/199; 438/231; 257/E21.637; 257/E27.062
(58) Field of Classification Search ............... 438/199, 438/231
See application file for complete search history.

(56) References Cited

U.S. PATENT DOCUMENTS

| | | | |
|---|---|---|---|
| 5,856,026 A * | 1/1999 | Joshi et al. ............. | 428/620 |
| 6,696,345 B2 | 2/2004 | Chau et al. | |
| 6,894,353 B2 | 5/2005 | Samavedam et al. | |
| 7,009,200 B2 | 3/2006 | Tezuka et al. | |
| 7,105,889 B2 * | 9/2006 | Bojarczuk et al. ............ | 257/324 |
| 2005/0145893 A1 | 7/2005 | Doczy et al. | |
| 2007/0034966 A1 | 2/2007 | Kim et al. | |
| 2007/0063295 A1 * | 3/2007 | Jeon et al. ................... | 257/410 |

OTHER PUBLICATIONS

U.S. Appl. No. 11/700,278, filed Jan. 31, 2007, Alshareef et al.

* cited by examiner

*Primary Examiner*—Alexander G Ghyka
(74) *Attorney, Agent, or Firm*—Warren L. Franz; Wade J. Brady, III; Frederick J. Telecky, Jr.

(57) ABSTRACT

A method of fabricating a dual metal gate structures in a semiconductor device, the method comprising forming a gate dielectric layer above a semiconductor body, forming a work function adjusting layer on the dielectric gate layer in the PMOS region, depositing a tungsten germanium gate electrode layer above the work function adjusting material in the PMOS region, depositing a tungsten germanium gate electrode layer above the gate dielectric in the NMOS region annealing the semiconductor device, depositing a metal nitride barrier layer on the tungsten germanium layer, depositing a polysilicon layer over the metal nitride, patterning the polysilicon layer, the metal nitride layer, the tungsten germanium layer, work function adjusting layer and the gate dielectric layer to form a gate structure, and forming a source/drain on opposite sides of the gate structure.

20 Claims, 12 Drawing Sheets

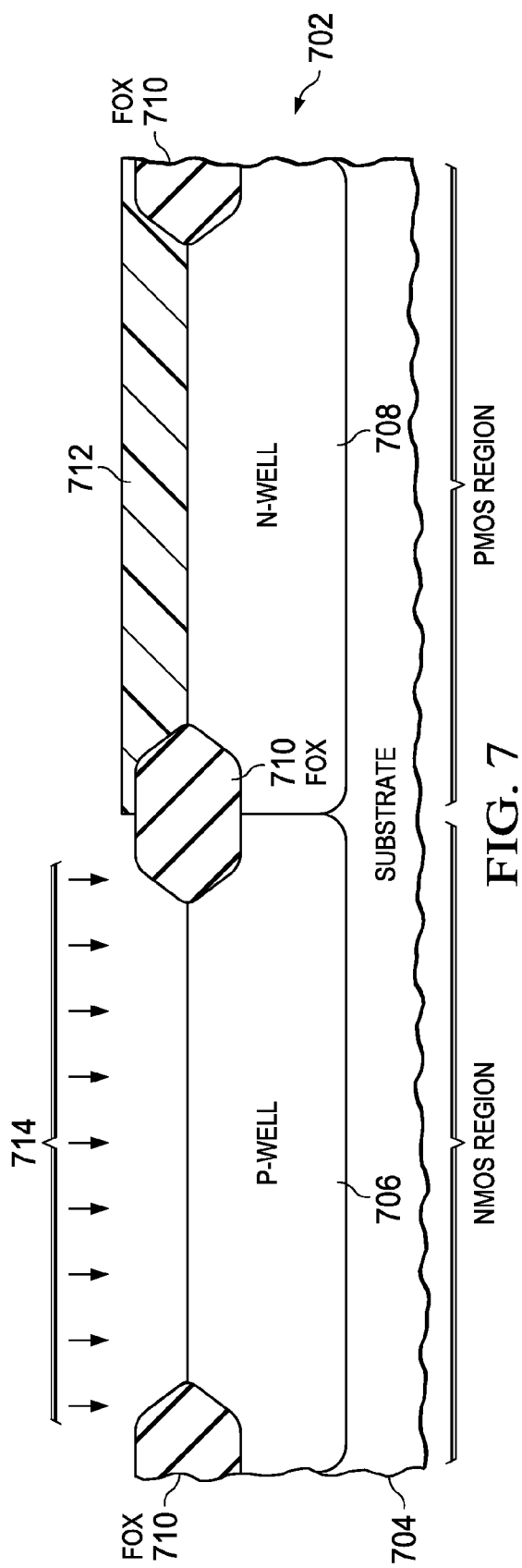
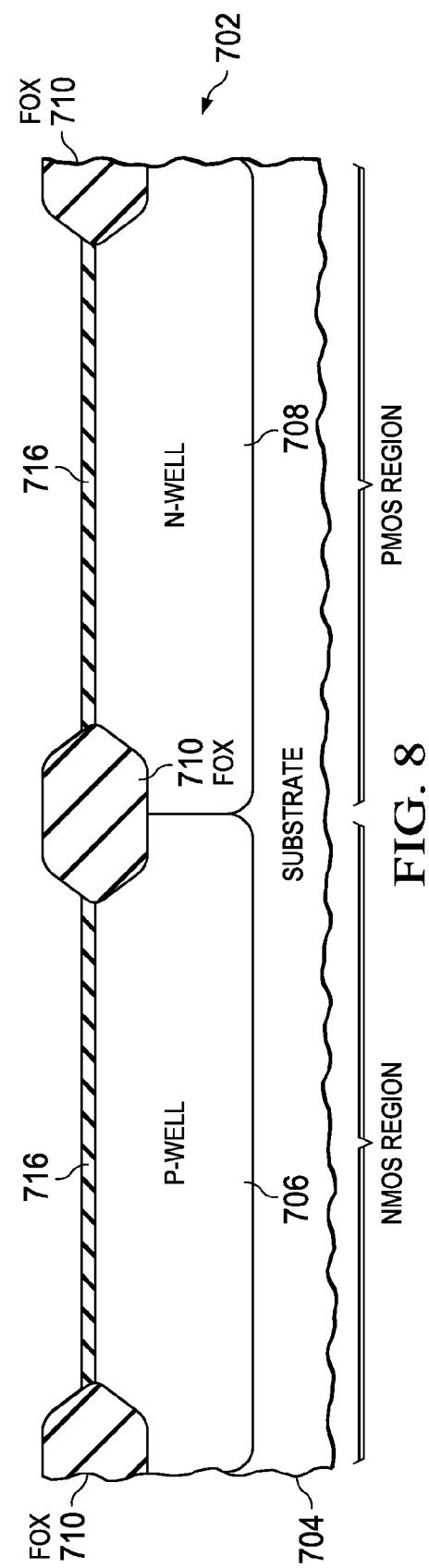
FIG. 7
FIG. 8

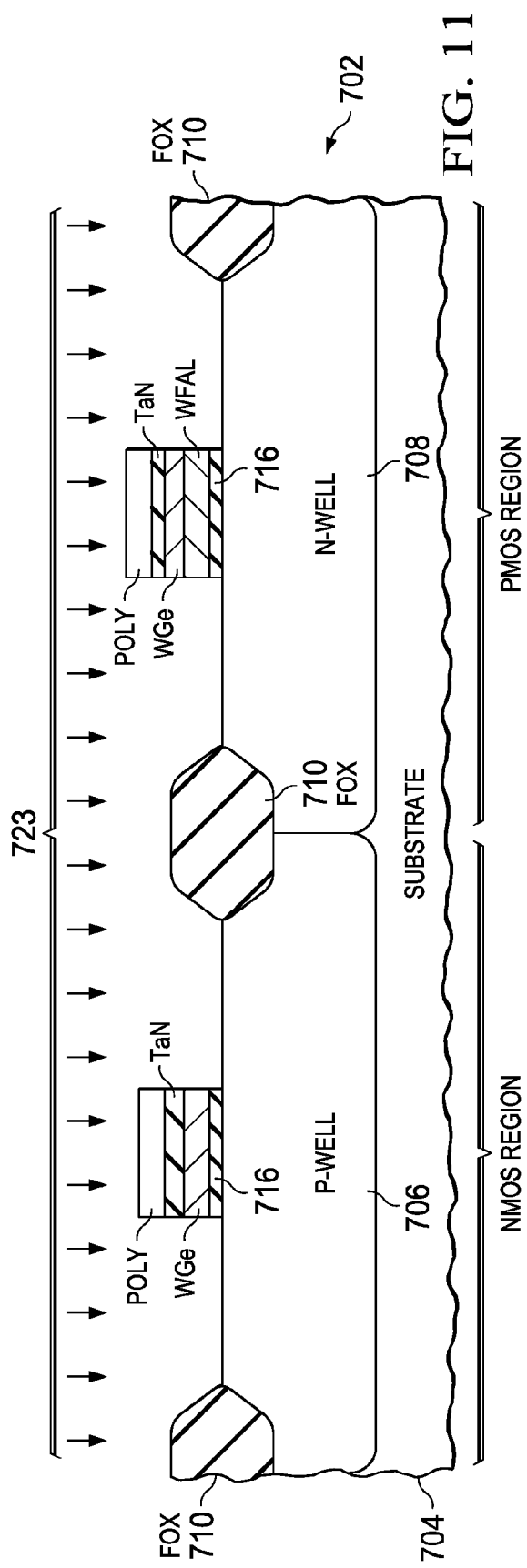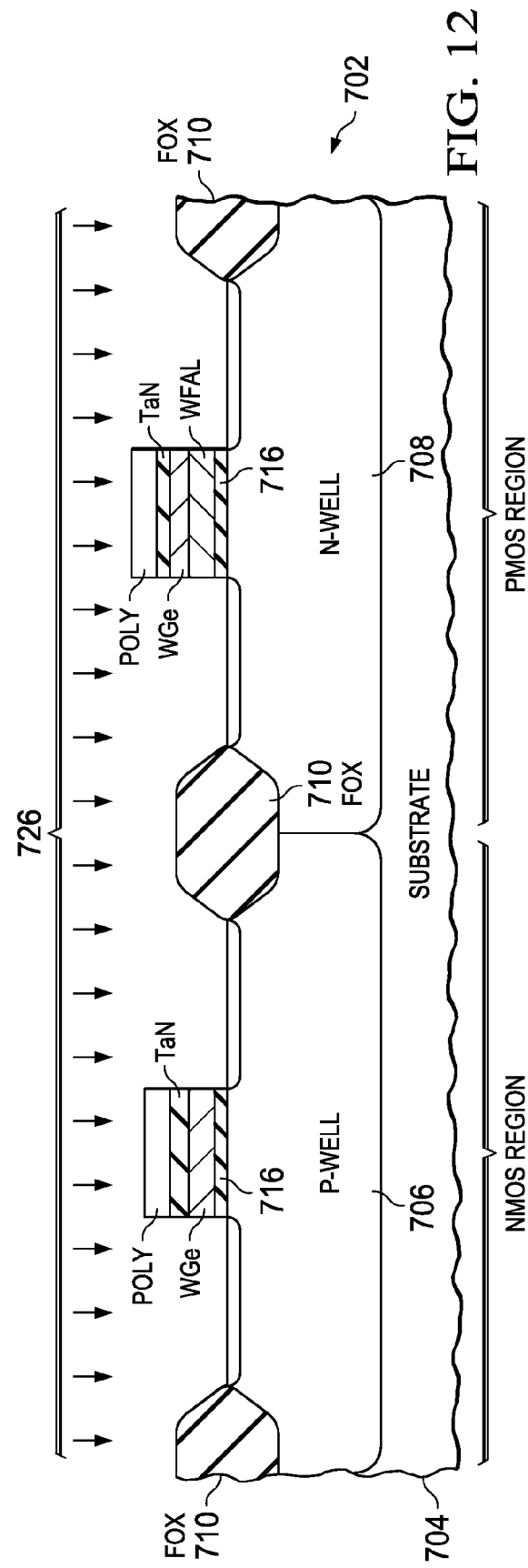

DOPED WGE TO FORM DUAL METAL GATES

FIELD OF INVENTION

The present invention relates generally to semiconductor devices and more particularly to metal gate metal-oxide-semiconductor (MOS) transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate or electrode is energized to create an electric field in a channel region of a semiconductor body, by which electrons or holes are allowed to travel through the channel between a source region and a drain region of the semiconductor body. The source and drain regions are typically formed by adding dopants to targeted regions on either side of the channel. A gate dielectric (insulator) or gate oxide is formed over the channel, and a gate electrode or gate is formed over the gate dielectric. The gate dielectric and gate electrode layers are then patterned to form a gate structure overlying the channel region of the substrate.

In operation of the resulting MOS transistor, the threshold voltage ($V_t$) is the gate voltage value required to render the channel conductive by formation of an inversion layer at the surface of the semiconductor channel. Complimentary MOS (CMOS) devices have become widely used in the semiconductor industry, wherein both n-channel and p-channel (NMOS and PMOS) transistors are utilized to fabricate logic and other circuitry. For enhancement-mode (e.g., normally off) devices the threshold voltage $V_t$ is positive for NMOS and negative for PMOS transistors. In other words, a type of device where there are no charge carriers in the channel when the gate source voltage is zero. The threshold voltage is dependent upon the flat-band voltage, and the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages ($V_t$) for the NMOS and PMOS transistors. To establish $V_t$ values, the work functions of the PMOS and NMOS gate and the corresponding channel materials are independently tuned or adjusted through gate and channel engineering, respectively.

Gate engineering is employed in combination with channel engineering to adjust the work function of the gate materials, where different gate work function values are set for PMOS and NMOS gates. The need to independently adjust PMOS and NMOS gate work functions has made polysilicon attractive for use as a gate material in CMOS processes, since the work function of polysilicon can be easily raised or lowered by doping the polysilicon with p-type or n-type impurities, respectively. The PMOS polysilicon gates are typically doped with p-type impurities and NMOS gate polysilicon is doped with n-type dopants, typically during implantation of the respective source/drain regions following gate patterning. In this way, the final gate work functions are typically near the Si conduction band edge for NMOS and near the valence band edge for PMOS. The provision of dopants into the polysilicon also has the benefit of increasing the conductivity of the gate. Polysilicon has thus far been widely using in the fabrication of CMOS devices, wherein the gate engineering (e.g., implants) are conventionally tuned to provide a desired gate conductivity (e.g., sheet resistance value), and the threshold voltage fine tuning is achieved by tailoring the $V_t$ adjust implants to change the channel work function.

FIG. 1 illustrates a conventional CMOS fabrication process 100 beginning at 102, in which front end processing is performed at 104, including well formation and isolation processing. At 106 and 108, channel engineering is performed (e.g., $V_t$, adjust, punch-thru, and channel stop implants) for NMOS and PMOS regions, respectively. A thin gate dielectric and an overlying polysilicon layer are formed at 110 and 112, respectively, and the polysilicon is patterned at 114 to form gate structures for the prospective NMOS and PMOS transistors. The gate structures are then encapsulated at 116, typically through oxidation, and lightly-doped drain (LDD) implants are performed at 118 to provide n-type dopants to prospective source/drains of the NMOS regions and p-type dopants to source/drains of the PMOS regions, using the patterned gate structures and isolation structures as an implantation mask. Sidewall spacers are then formed at 120 along the lateral sidewalls of the gate structures.

At 122, the PMOS source/drain regions and the PMOS polysilicon gate structures are implanted with p-type dopants to define the PMOS source/drains, and to render the PMOS gates conductive. Similarly, the NMOS source/drain regions and the NMOS polysilicon gate structures are implanted at 124 with n-type dopants, to defining the NMOS source/drains and rendering the NMOS gates conductive. Thereafter, the source/drains and gates are silicided at 126 and back end processing (e.g., interconnect metallization, etc.) is performed at 128, before the process 100 ends at 130. In the conventional process 100, the channel engineering implants at 106 and 108 shift the work functions of the PMOS and NMOS channel regions, respectively, to compensate for the changes in the PMOS and NMOS polysilicon gate work functions resulting from the source/drain implants at 122 and 124, respectively. In this manner, the desired work function difference between the gates and channels may be achieved for the resulting PMOS and NMOS transistors, and hence the desired threshold voltages.

The gate dielectric or gate oxide between the channel and the gate is an insulator material, typically $SiO_2$, nitrided $SiO_2$ or other dielectrics that operate to prevent large currents from flowing from the gate into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin nitrided $SiO_2$ gate dielectric layers to prevent dopant diffusion from the gate polysilicon into the underlying channel. Accordingly, recent scaling efforts have focused on high-k dielectric materials having dielectric constants greater than that of nitrided $SiO_2$, which can be formed in a thicker layer than scaled nitrided $SiO_2$, and yet which produce equivalent field effect performance. A thicker high-k dielectric layer can thus be formed to avoid or mitigate tunneling leakage currents, while still achieving the required electrical performance equivalent (e.g., capacitance value) to a thinner nitrided $SiO_2$.

It has also been proposed to utilize two dissimilar metals for the gates; however, this approach is difficult to integrate. There are often adhesion problems associated with the two metals. There are also problems etching two dissimilar metals to form the transistor gates. There have been recent advances in fully silicided gates (FUSI) as an option for metal gate integration to achieve transistor performance while scaling down to 45 nm and below. Undoped Ni FUSI has a mid-gap work function which is not suitable for high-performance CMOS applications. Implant doped Ni FUSI has shown n-type and p-type work functions within 200 mV of band edge. However, high-performance CMOS requires band edge work functions. With the relatively thick gate dielectrics and gate structures of the past, polysilicon depletion was not critical to ensuring desired device performance. However, as gate dielectrics and gate continue to become smaller through scaling, the polysilicon depletion problem is more pronounced, wherein polysilicon depletion regions of 3 to 4 angstroms become a significant fraction of the overall effective gate capacitance. Thus, while polysilicon gate have previously offered flexibility in providing dual work functions for CMOS processes, the future viability of conventional polysilicon gate technology is lessened as scaling efforts continue. Accordingly, attention has recently been directed again to the possibility of using metal gates in CMOS products. There remains a need for dual or differentiated work function capability (e.g., for PMOS and NMOS transistors) in CMOS processes. In this regard, metal work functions are not shifted as easily by the same amounts as was the case for polysilicon.

Accordingly, there is a need for improved CMOS transistor gate designs and fabrication techniques by which the benefits of scaling can be achieved while avoiding or mitigating the poly depletion degradation found in conventional devices and without increasing equivalent oxide thickness (EOT).

SUMMARY OF THE INVENTION

In one embodiment, the invention is directed to a method of fabricating a metal gate structures in a semiconductor device, the method comprising forming a gate dielectric layer above a semiconductor body, forming a work function adjusting layer on the dielectric gate layer, depositing a tungsten germanium gate electrode layer above the work function adjusting material, annealing the semiconductor device, depositing a metal nitride barrier layer on the tungsten germanium layer, depositing a polysilicon layer over the metal nitride, patterning the polysilicon layer, the metal nitride layer, the tungsten germanium layer, work function adjusting layer and the gate dielectric layer to form a gate structure, lightly doped drain extensions, side walls and forming a source/drain on opposite sides of the gate structure.

In another embodiment, the invention is directed to a method of forming metal gate structures in a semiconductor device, the method comprising depositing a gate dielectric layer on a semiconductor body, depositing or co-sputtering a tungsten germanium gate electrode, implanting the work function adjusting material into the tungsten germanium, annealing the semiconductor device at sufficient temperature to diffuse the work function adjusting material to the dielectric/metal electrode interface, depositing a metal nitride barrier layer, depositing a polysilicon layer, patterning the polysilicon layer, the metal nitride, the tungsten germanium gate electrode, and the gate dielectric layer to form a gate structure, lightly doped drain extensions, side walls and forming a source/drain on opposite sides of the gate structure.

BRIEF DESCRIPTION OF THE DRAWINGS

FIGS. 7-15 are partial side elevation views in section illustrating exemplary NMOS and PMOS transistors undergoing CMOS metal gate processing in accordance with the invention at various stages of fabrication.

DETAILED DESCRIPTION OF THE INVENTION

Figure 1:
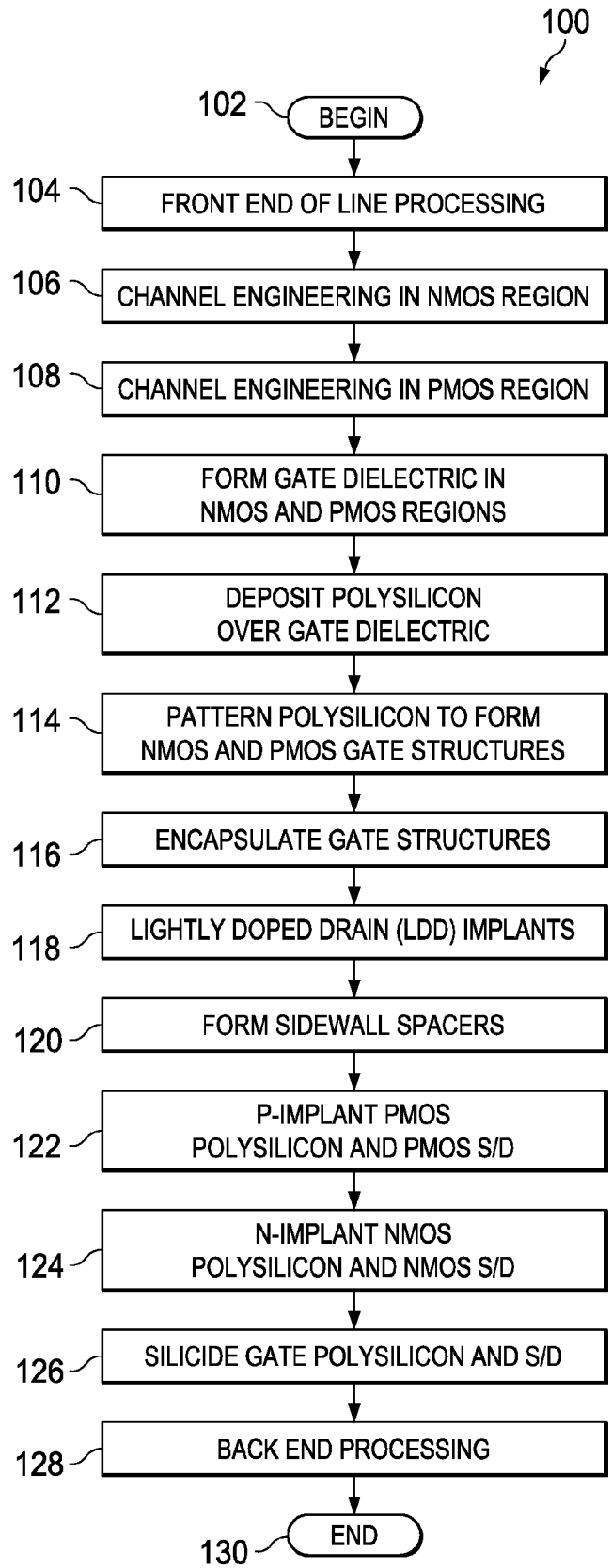
FIG. 1 is a simplified flow diagram illustrating a conventional polysilicon gate CMOS fabrication process including channel engineering for both PMOS and NMOS transistors.

One or more implementations of the present invention will now be described with reference to the attached drawings, wherein like reference numerals are used to refer to like elements throughout, and wherein the illustrated structures are not necessarily drawn to scale. The invention relates to metal gate CMOS devices used for NMOS and PMOS transistors, respectively. The invention may be employed in order to meet transistor performance requirements for reduced size technology nodes.

Figure 2:
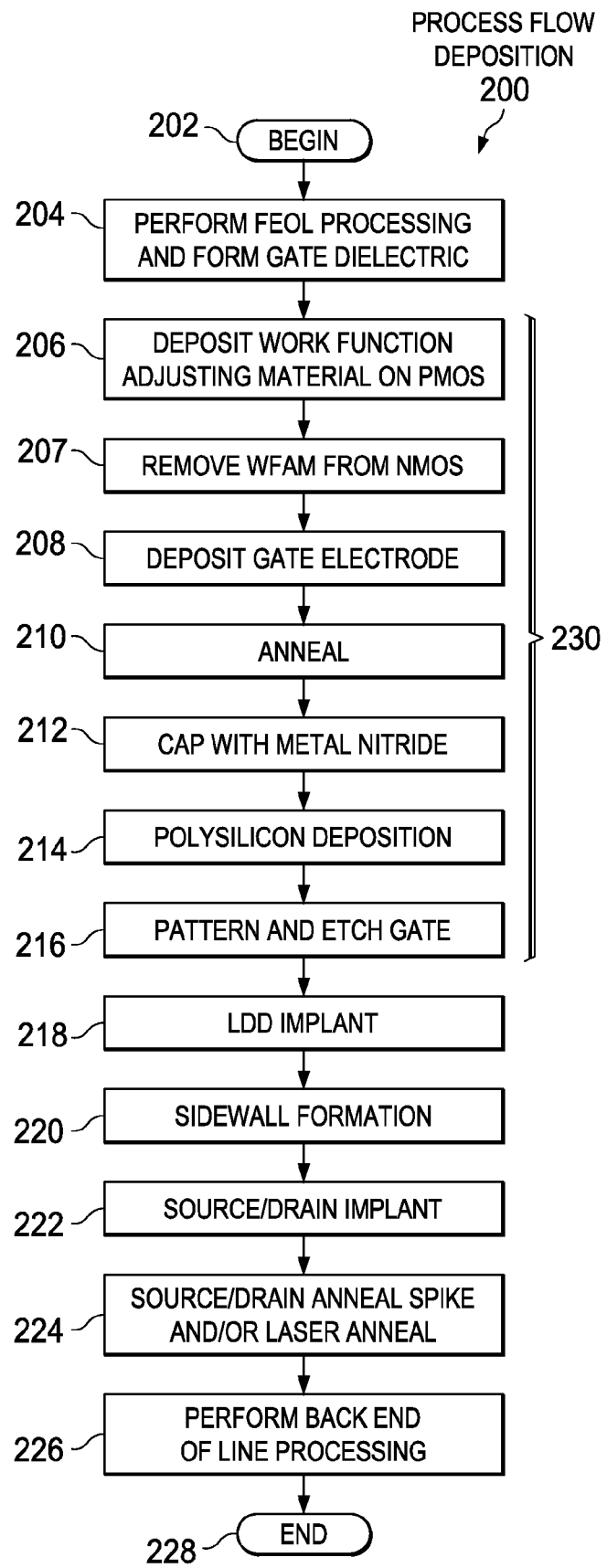
FIG. 2 is a partial flow diagram illustrating an exemplary method of utilizing doped tungsten germanium (WGe) to form dual metal gates in accordance with an aspect of the present invention.
Figure 3:
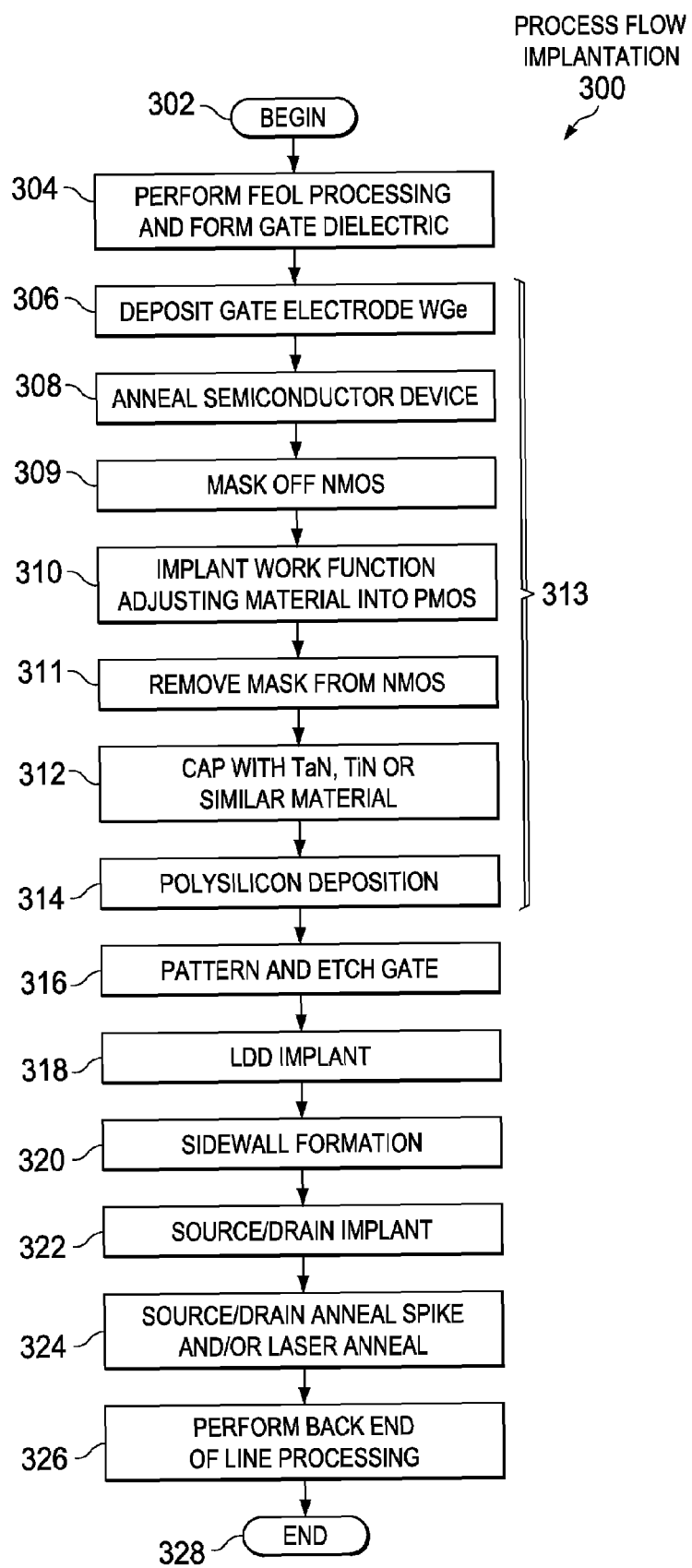
FIGS. 3-6 are partial flow diagrams illustrating various techniques for forming tuned PMOS and NMOS metal gate structures with differentiated work functions according to another aspect of the present invention.
Figure 4:
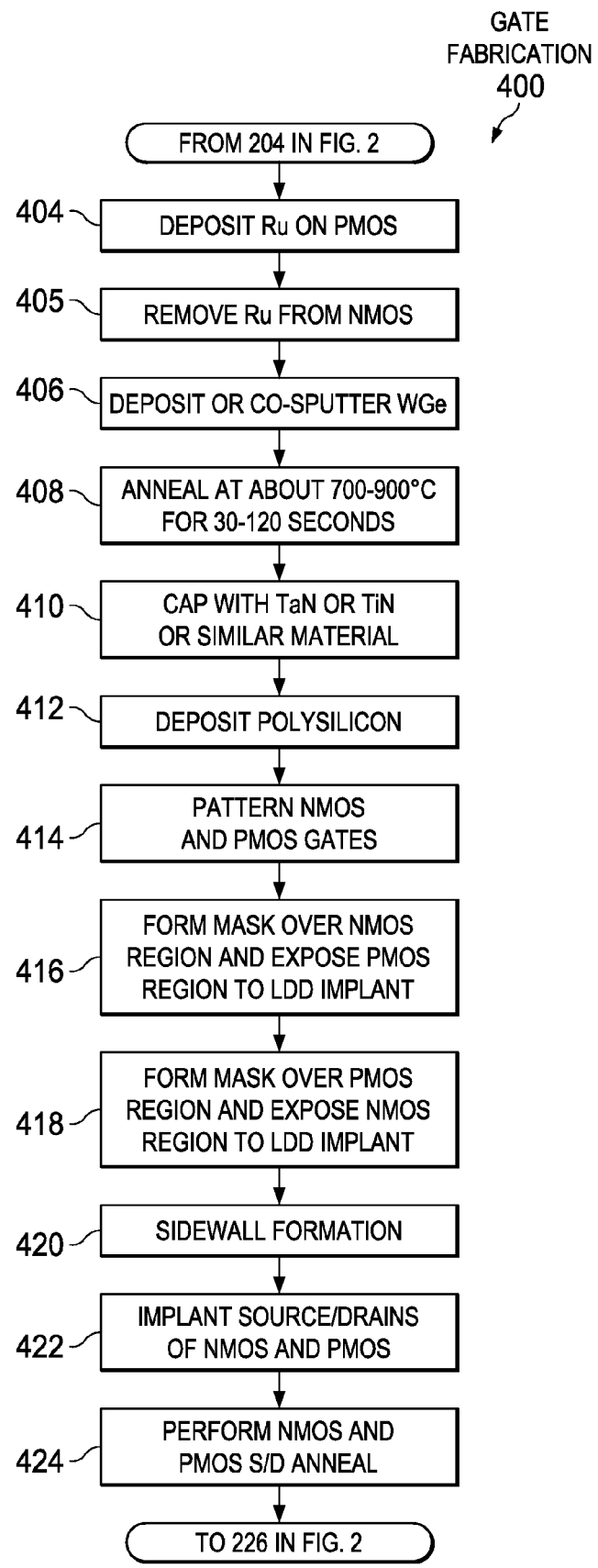

Referring initially to FIGS. 2 and 4, an exemplary process flow for deposition of the work function adjusting layer is illustrated. FIG. 3 illustrates another process flow involving implantation into the tungsten germanium electrode of the work function adjusting material. FIG. 2 illustrates an exemplary method 200 for fabricating metal gate structures for PMOS and NMOS transistors in accordance with the present invention according to the general approach taken for deposition of the work function adjusting layer. FIG. 4 illustrates various exemplary implementations of portions of the method 200 of FIG. 2 relating to creation of gate structures with differentiated work functions using a single starting material. While the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 200 illustrating a process flow involving deposition begins at 202 in FIG. 2, wherein front end of line processing is performed at 204. Any front end processing may be performed within the scope of the invention, wherein the processing at 204 may include, for example, formation of n and p wells using diffusion, implantation, or other suitable processing steps, as well as formation of isolation structures in field regions of a device wafer using local oxidation of semiconductor (LOCOS), shallow trench isolation (STI), field oxide (FOX), or any suitable isolation processing. The methods and devices of the invention may be implemented using any type of semiconductor body, including but not limited to bulk semiconductor wafers (e.g., silicon), epitaxial layers formed over a bulk semiconductor, silicon on insulator (SOI) wafers, etc.

In addition, at 204, a gate dielectric is formed in the NMOS and PMOS regions using any suitable materials, material thicknesses, and processing steps, including a single thermal oxidation or deposition or combinations thereof to form a gate dielectric above the semiconductor body, which may be a single layer or multiple layers. The invention may be employed in conjunction with gate dielectric materials formed from high-k dielectrics, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), nitrided oxide, nitrides $SO_2$, lanthanum oxynitride (LaON), yttrium oxynitride (YON), as well as their silicates and aluminates such as zircon (ZrSiO), hafnium silicate (HfSiO), LaSiO, YSiO, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others. Separate processing may optionally be employed to form different gate dielectrics in the NMOS and PMOS regions within the scope of the invention. In the examples illustrated and described herein, a single thermal oxidation is performed at 204 to create a thin $SiO_2$ gate dielectric oxide overlying the substrate in the NMOS and PMOS regions.

Following gate dielectric formation at 204, the method 200 provides for forming or depositing a thin layer of work function adjusting material (WFAM) at 206. The WFAM deposited in the PMOS region remains, whereas the WFAM in the NMOS region is removed at 207. The WFAM is removed utilizing techniques that are well known by those of ordinary skill in the art. The gate fabrication is indicated generally at 230, wherein FIG. 2 illustrates the general metal gate fabrication principles of the method 400, and FIG. 4 illustrates a few of the embodiments of the gate fabrication 200, as described further below. The work function of a material is defined as the difference between the vacuum energy level and the Fermi energy level of the material.

In one embodiment illustrated in FIG. 4 at 404, the work function adjusting material can comprise about 5 Å to 20 Å layer of ruthenium (Ru), for example. A 10 Å layer of ruthenium can be formed on the gate dielectric 404 PMOS region and NMOS region, as illustrated in FIG. 4, in another embodiment. It should be appreciated that other WFAM can be utilized, e.g., molybdenum, tungsten, rhodium, palladium, technetium, rhenium, osmium, iridium, platinum, and other p-type dopants. At 405, for example the ruthenium is removed from the NMOS. A layer of tungsten germanium (WGe) can be deposited on the work function adjusting material at 208 (FIG. 2), for example. The WGe layer in one embodiment can range in thickness of about 50 Å to 150 Å, for example, 50 Å as shown at 406 (FIG. 4). An anneal process is performed at 210 (FIG. 2) to drive, diffuse or activate the implanted work function adjusting material into the underlying gate dielectric in the PMOS region, for example. The annealing process at 408 (FIG. 4) in one embodiment is performed at a temperature of about 700° C. to about 900° C. in a nitrogen atmosphere for a period of time sufficient to bond the work function adjusting material into the gate dielectric, for example. The period of time can range from about 30 to 120 seconds, for example. A barrier layer of metal nitride is formed over the tungsten germanium at 212 in the NMOS and PMOS regions to a thickness of, in one embodiment, from about 20 Å to about 120 Å, and in one embodiment a thickness of about 100 Å. The metal nitride may be formed at 410 (FIG. 4) at any relative component concentration (uniform or profiled), using any suitable deposition process.

Any metal nitride may be used within the scope of the invention, including but not limited to metals containing nitrogen or metal alloys containing nitrogen, of any stoichiometry or relative concentrations of metal/metal alloy and nitrogen. The materials may be formed using any metals, ternary metals, or metal alloys within the scope of the invention, for example, those that include Ti, Ta, Hf, Zr, W, or others. Thus, although illustrated in FIG. 4 at 410 and described in the examples below primarily in the context of TiN and TaN, metal nitrides including but not limited to metal nitrides $M_xN_y$, metal silicon nitrides, $M_xSi_yN_z$, metal aluminum nitrides $M_xAl_yN_z$, and metal aluminum silicon nitrides $M_wAl_xSi_yN_z$ (where M is a metal such as Ti, Ta, Hf, Zr, W, etc.), or equivalents may be used within the scope of the invention.

In FIG. 4 at 412, a layer of polysilicon is deposited over the metal nitride layer via a chemical vapor deposition (CVD), atomic layer deposition (ALD), physical vapor deposition (PVD), or other suitable deposition process in both the NMOS and PMOS regions. The thickness of the polysilicon layer will be, in one embodiment, from about 400 to 1200 Å. As illustrated in FIG. 2 at 216 and in one embodiment, at 414 in FIG. 4 the gate stacks are patterned and etched. In FIG. 4, the gate stack of the NMOS and the PMOS are patterned using a mask and an etch process to define patterned NMOS and PMOS gate structures at 414. The patterning and etching processes are well known to one of ordinary skill in the art.

In general, the positive gate voltage of an n-channel device can be larger than some threshold voltage before a conducting channel can be induced. Likewise, the negative gate voltage of a p-channel device can be more negative than some threshold voltage to induce the required positive charge in the channel, for example. The n-type dopants comprise, for example, arsenic (As), phosphorous (P), antimony (Sb), and nitrogen (N), whereas the p-type dopants comprise boron (B), ruthenium (Ru), indium (In), gallium (Ga), molybdenum (Mo), and tungsten (W).

As illustrated in FIG. 2 at 218 a lightly doped drain (LLD) implantation can be performed. In one embodiment, at 416 and 418 in FIG. 4, the NMOS and PMOS regions are alternatively masked and LLD implanted to form shallow drain extensions in the NMOS and PMOS regions. The operational settings of the LLD implantation process 416 and 418 (e.g., species, energy, dose, etc.) may be selected to provide any suitable concentrations and depth profiles thereof, wherein dopants are preferably introduced near the interface of the gate dielectric without doping the underlying channel region of the substrate. Sidewall spacers are then formed at 220 along the lateral sidewalls of the gate structures formed in FIG. 4, at 420. Various sidewall spacer fabrication processes are well known by those of ordinary skill in the art, and all of them are contemplated in this invention.

At 422 (FIG. 4), the NMOS source/drain regions and the NMOS polysilicon gate structures can be implanted with n-type dopants to further define the NMOS source/drains, and to render the NMOS gates conductive. Similarly, the PMOS source/drain regions and the PMOS polysilicon gate structures can be implanted at 422 with p-type dopants, further defining the PMOS source/drains and rendering the PMOS gates conductive. Thereafter, the source/drains and gates can be annealed at 424 and the process returns to 226 and back end processing (e.g., interconnect metallization, etc.) can be performed, before the process 200 ends at 228.

Figure 5:
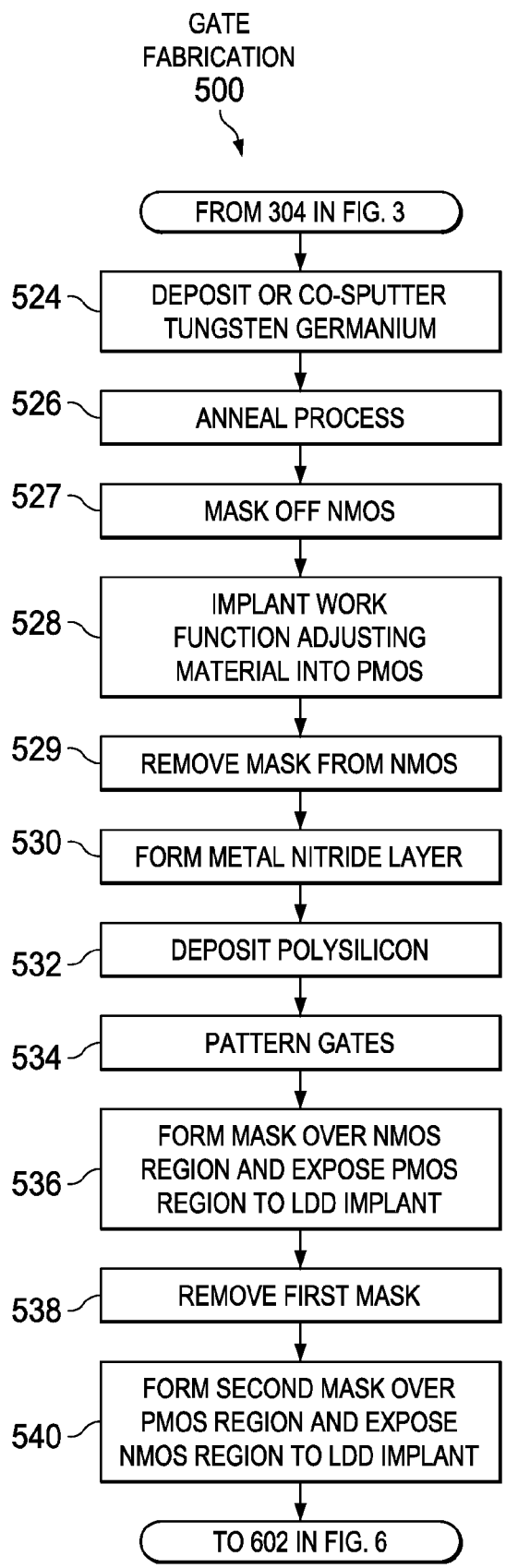
Figure 6:
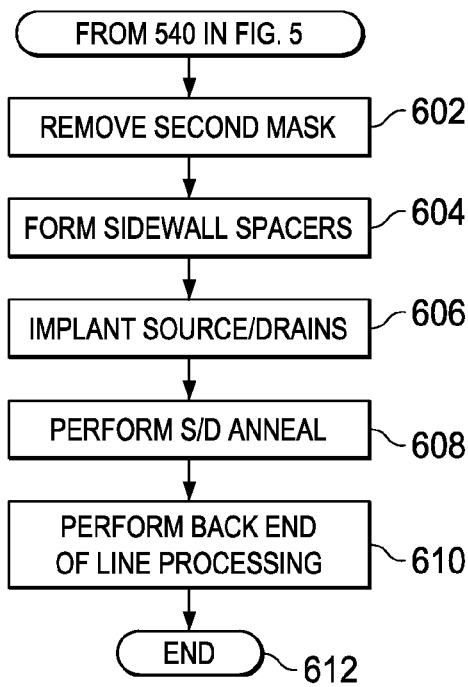

Referring to FIGS. 3, 5 and 6, yet another exemplary method 300 is illustrated in FIG. 3 for creating metal gate structures for NMOS and PMOS transistors in accordance with the present invention. In addition, FIGS. 5 and 6 illustrate various exemplary implementations of portions of the method 300 relating to manufacture of gate structures with differentiated work functions using a single starting material. As stated supra, although the exemplary method 300 is shown and described as a series of acts or events, the present invention is not limited by the illustrated ordering of such acts or events, as will be appreciated. Some acts may occur in different orders and/or at the same time with other acts or events apart from those illustrated and/or described herein, in accordance with the invention. In addition, not all of the described or illustrated steps may be required to implement the present invention. In addition, the methods according to the present invention may be implemented in association with the formation and/or processing of structures illustrated and described herein as well as in association with other structures and devices not illustrated.

The method 300 begins at 302 in FIG. 3, wherein front end of line processing is performed at 304. Any front end processing may be performed within the scope of the invention, wherein the processing at 304 may include, formation of n and p wells using diffusion, implantation, or other suitable processing steps, as well as formation of isolation structures in field regions of a device wafer using LOCOS, STI, FOX, or any appropriate isolation processing, for example. The methods and devices of the invention may be implemented using any type of semiconductor body, including but not limited to bulk semiconductor wafers, SOI wafers, and the like.

Additionally, at 304, a gate dielectric layer can be formed in the NMOS and PMOS regions using any suitable materials, material thicknesses, and processing steps, including a single thermal oxidation or deposition or combinations thereof to form a gate dielectric layer above the semiconductor body, which may be a single layer or multiple layers. The invention may be employed in conjunction with gate dielectric materials formed from high-k dielectrics, including but not limited to metal oxides including those discussed supra. Separate processing may optionally be employed to form different gate dielectrics in the NMOS and PMOS regions within the scope of the invention. In the examples illustrated and described herein, a single thermal oxidation is performed at 304 to create a thin $SiO_2$ gate dielectric oxide overlying the substrate in the NMOS and PMOS regions.

A WGe layer, in one embodiment at 306 (FIG. 3) and 520 (FIG. 5), can be deposited or sputtered or formed on the gate dielectric to a range of about 50 Å to 150 Å thick, for example, 50 Å. The inventors recognized the advantage of utilizing WGe, which is formed/annealed at 308 (FIG. 3) and 526 (FIG. 5) at the temperature of 700° to 900° C., creates a smooth dielectric/electrode interface which can prevent channel electron scattering resulting in low electron mobility, and a low rate of thermal expansion compared to NiSi and $WSi_2$ which helps to prevent regions of high stress in the WGe film. At 309 the NMOS region or NMOS can be masked utilizing processes that are well known to one of ordinary skill in the art.

At 310 and 528 the work function adjusting material is implanted into the WGe of the PMOS region or PMOS. The work function adjusting material can be ruthenium (Ru), molybdenum (Mo), tungsten (W), and the like. At 311 the mask applied at 309 is removed using techniques well known by those of ordinary skill in the art. The gate fabrication is indicated generally at 313 in FIG. 3.

In FIG. 3 at 312 a barrier layer of a TaN, for example, is deposited on the WGe and a layer of polysilicon is deposited over the TaN layer via a CVD, ALD, PVD, or other suitable deposition process in both the NMOS and PMOS regions. Any metal nitride may be used within the scope of the invention, including, but not limited to metals containing nitrogen or metal alloys containing nitrogen, of any stoichiometry or relative concentrations of metal/metal alloy and nitrogen. The materials may be formed using any metals, ternary metals, or metal alloys within the scope of the invention, for example, those that include Ti, Ta, Hf, Zr, W, or others. Thus, although described in the examples below primarily in the context of TiN and TaN, metal nitrides including but not limited to metal nitrides $M_xN_y$, metal silicon nitrides, $M_xSi_yN_z$, metal aluminum nitrides $M_xAl_yN_z$, and metal aluminum silicon nitrides $M_WAl_xSi_yN_z$ (where M is a metal such as Ti, Ta, Hf, Zr, W, etc.), or equivalents may be used within the scope of the invention. At 314 (FIG. 14) and 532 (FIG. 5) polysilicon is deposited as discussed supra.

As illustrated in FIG. 3 at 316 and in one embodiment, at 534 in FIG. 5 the gates are patterned and etched. The various gate stack layers of the NMOS and the PMOS are patterned using a mask and an etch process to define patterned NMOS and PMOS gate structures. The formation of gate structures is well known by those of ordinary skill in the art.

As illustrated in FIG. 3 at 318 and FIG. 5 and FIG. 6, a lightly doped drain (LLD) implantation can be performed. In one embodiment, at 536, 538 and 540 of FIG. 5 and 602 in FIG. 6, the NMOS and PMOS regions are alternatively masked and LLD implanted to form source/drain regions in the NMOS and PMOS regions. The operational settings of the LLD implantation process (e.g., species, energy, dose, etc.) may be selected to provide any suitable concentrations and depth profiles thereof, wherein dopants are preferably introduced near the interface of the gate dielectric without doping the underlying channel region of the substrate. Sidewall spacers are then formed at 320 (FIG. 3) along the lateral sidewalls of the gate structures formed in FIG. 6, at 604. Various sidewall spacer fabrication processes are well known by those of ordinary skill in the art, and all of them are contemplated in this invention.

At 606 (FIG. 6), the PMOS source/drain regions and the PMOS polysilicon gate structures are implanted with p-type dopants to further define the PMOS source/drains, and to render the PMOS gates conductive. Similarly, the NMOS source/drain regions and the NMOS polysilicon gate structures are implanted at 606 with n-type dopants, further defining the NMOS source/drains and rendering the NMOS gates conductive. Thereafter, the source/drains and gates are annealed at 608 and back end processing (e.g., interconnect metallization, etc.) is performed at 610, before the process 600 ends at 612.

Referring now to FIGS. 7-15, an exemplary CMOS device 702 is illustrated at various stages of fabrication processing generally according to the method 200 of FIG. 2 and method 400 of FIG. 4. In this example, the gate fabrication for the NMOS and PMOS transistors (e.g., FIGS. 2 and 4) is illustrated in further detail in FIG. 7, where the CMOS device 702 includes a silicon substrate semiconductor body 704 with a p-well 706 formed in an NMOS region and an n-well 708 formed in a PMOS region. The device 702 further comprises field oxide (FOX) isolation structures 710, where the wells 706, 708 and the field oxide 710 are formed during front-end processing (e.g., at 204 in FIG. 2). A mask 712 is formed that covers the PMOS region and exposes the NMOS region, and one or more NMOS channel engineering implantation processes 714 are performed (e.g., 204 in FIG. 2), which may include a $V_t$ adjust implant to introduce boron or other p-type dopants into a prospective NMOS channel region, as well as a p-type punch-thru implant, and a p-type channel stop implant. As illustrated in FIG. 8, a gate dielectric layer 716 is formed above the substrate 704 in both the NMOS and the PMOS regions (204 in FIG. 2). The gate dielectric layer 716 will be, in one embodiment, from about 20 Å to about 40 Å thick.

Figure 9:
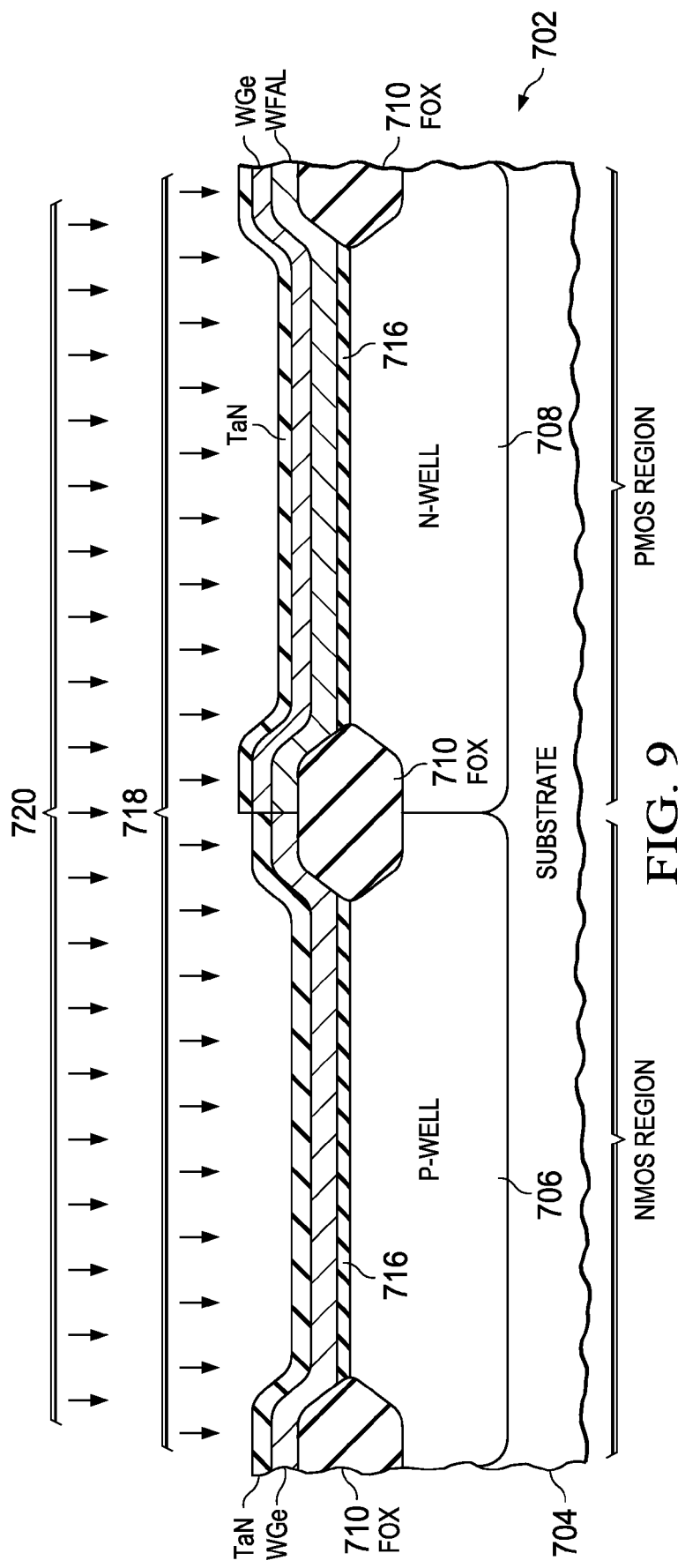

In FIG. 9, a WGe layer is deposited or co-sputtered 718, for example, on the work function adjusting layer to approximately about 50 Å to 150 Å in the PMOS region (the NMOS region in this embodiment is masked off). An anneal 720 (FIG. 9) can be performed at 210 (FIG. 2) to drive or diffuse the work function adjusting layer into the dielectric in the NMOS and PMOS regions. Annealing is generally performed at a temperature from about 600° C. to about 1000° C. in a nitrogen atmosphere for a period of time sufficient to react the work function adjusting layer with the gate dielectric and the WGe layers. In addition, a work function adjusting material can be implanted into the WGe and dielectric gate layers in the PMOS region.

The work function adjusting material, is a layer comprised of, for example, Ru. The layer of ruthenium (Ru) is about 5 Å to 20 Å, for example, 10 Å. A layer of WGe is deposited on the Ru layer. The WGe layer can be, in one embodiment, from 50 to 150 Å, for example 50 Å. Also in FIG. 9, a barrier layer of a TaN (e.g., or other metal nitride material) is deposited on the WFAL and ruthenium in the PMOS region, as discussed supra. The thickness of the TaN or TiN layer can be, in one embodiment, from about 20 Å to 120 Å, for example, 100 Å.

Figure 10:
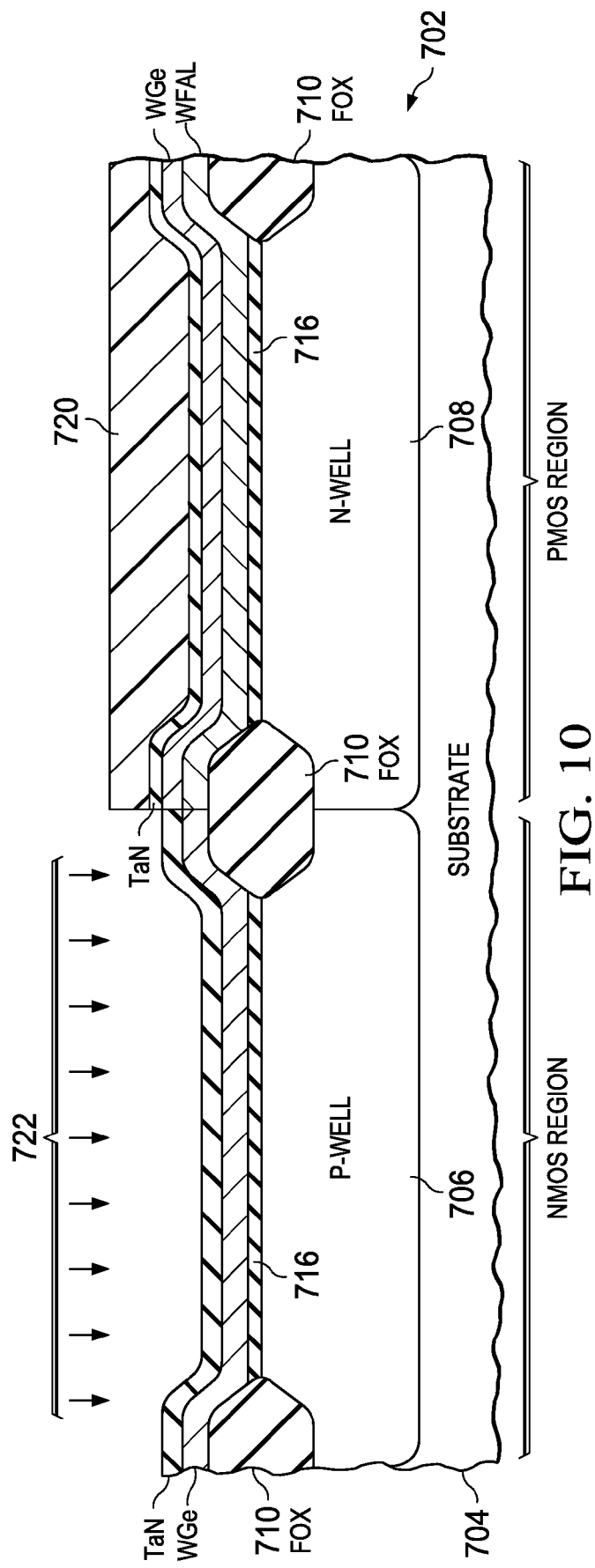

Polysilicon is then deposited as illustrated in FIG. 10 over metal nitride layer in the NMOS and PMOS regions, using any suitable deposition process. The NMOS and the PMOS devices are patterned using a mask and an etch process 723 to define patterned NMOS and PMOS gate structures, as shown in FIG. 11. In this implementation of the invention a source/drain extension or LLD implantation 726 is executed by selectively implanting the NMOS region and the PMOS region. Toward that end, a mask (not shown) is formed in FIG. 11 to cover the PMOS region and expose the NMOS region. Thereafter a second mask (not shown) is formed in FIG. 12 to cover the NMOS region and expose the PMOS region, for example. The operational settings of the implantation process 726 (e.g., species, energy, dose, etc.) may be selected to provide the proper resistance of the LDD region. Following the first and second mask removal, a resist strip or a wet etch or a plasma or a combination is utilized to remove of the polysilicon and any other screen layers.

Figure 13:
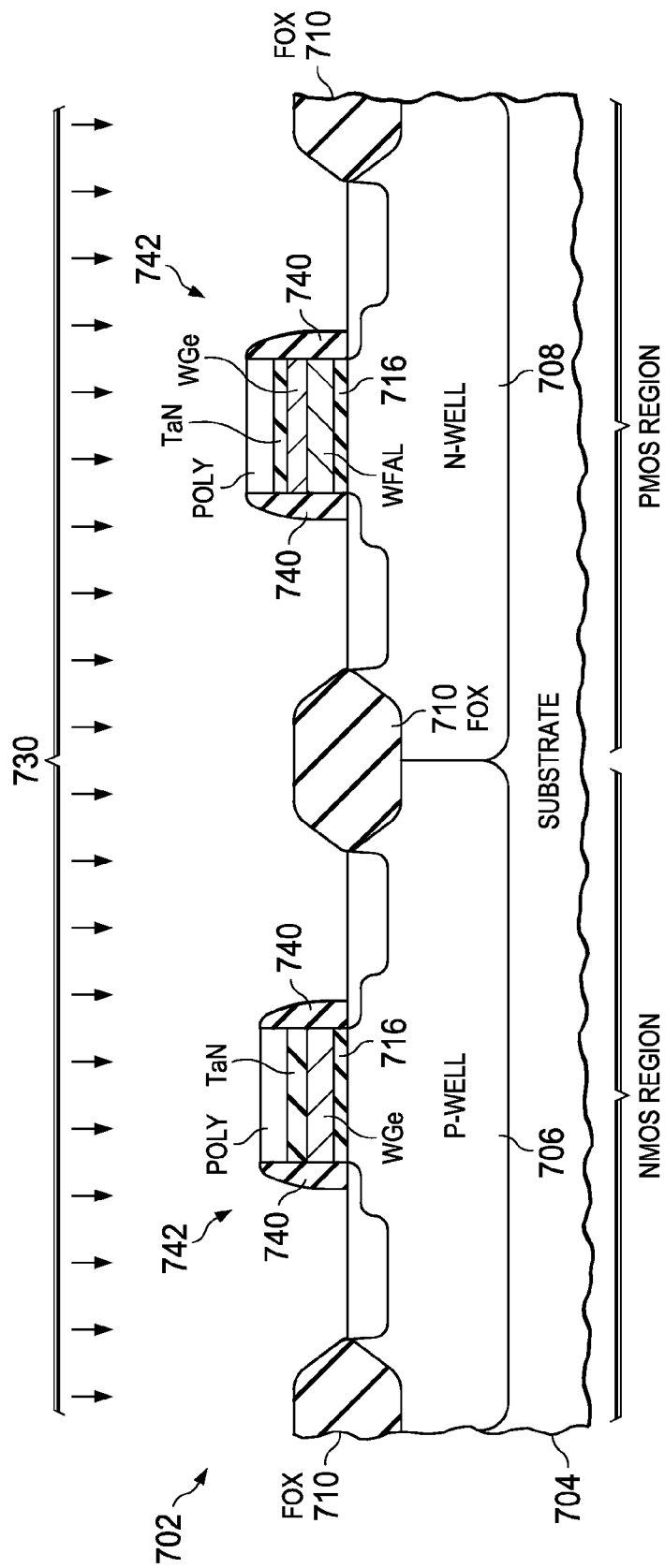
Figure 14:
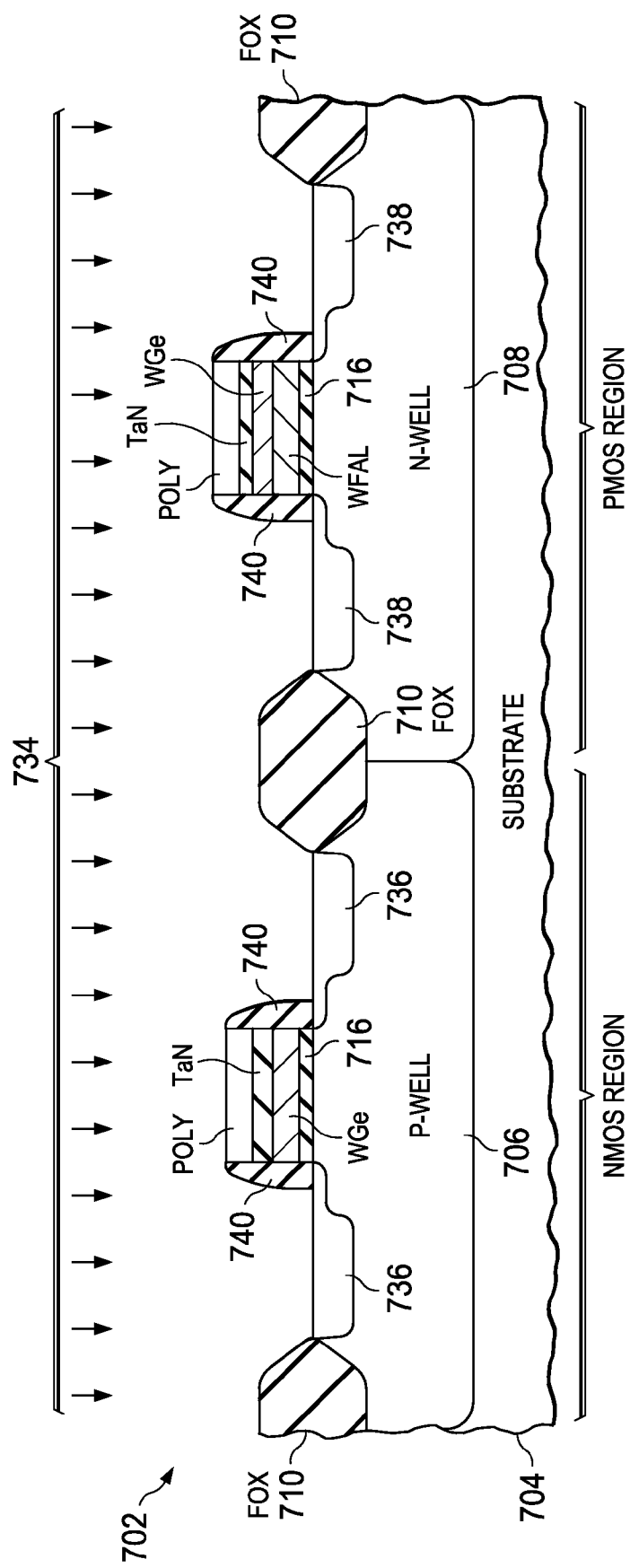
Figure 15:
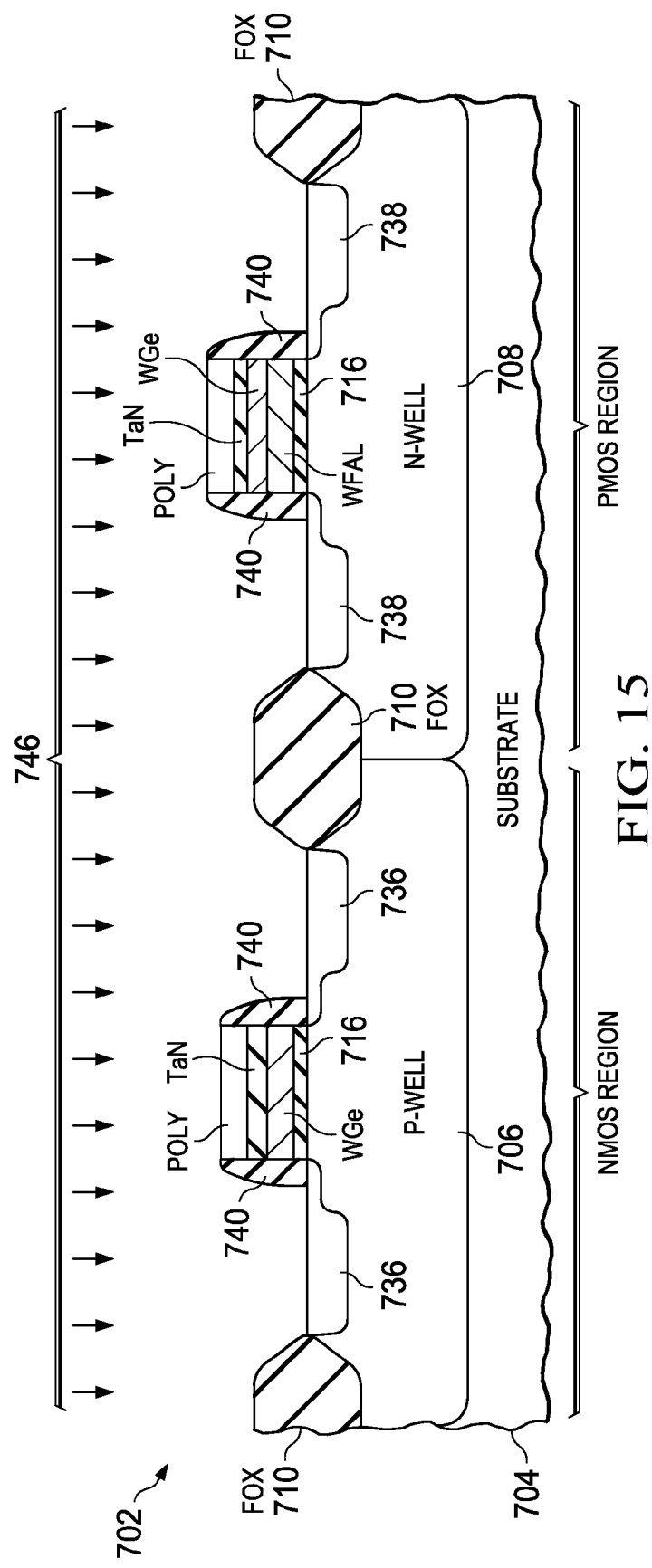

In FIG. 13, $SiO_2$ and/or $Si_3N_4$ sidewall spacers 740 are formed 730, for example, along the lateral sidewalls of the patterned gate structures (742 in FIG. 13), and source/drain implants 734 are performed in FIG. 14, using suitable masks (not shown) to further define the source/drains implantation regions, 736 and 738, in the NMOS and PMOS regions. An anneal is performed in FIG. 15 at 746 to drive or diffuse the structured gate layers. Annealing is this embodiment can be performed at a temperature of about 500° C. to about 1000° C. in a nitrogen atmosphere for a period of time (e.g., 30 to 120 seconds) sufficient to diffuse and activate the source/drain regions. Thereafter other back-end processing may be performed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, gsystems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating dual metal gate structures in a semiconductor device, the method comprising:
    forming a gate dielectric layer in PMOS and NMOS regions above a semiconductor substrate;
    forming a work function adjusting layer on the dielectric gate layer in the PMOS region;
    depositing a tungsten germanium gate electrode layer above the work function adjusting material in the PMOS region;
    depositing a tungsten germanium gate electrode layer above the gate dielectric layer in the NMOS region;
    annealing the semiconductor device;
    depositing a metal nitride barrier layer on the tungsten germanium layer in the PMOS region and on the tungsten germanium layer in the NMOS region;
    depositing a polysilicon layer over the metal nitride barrier layer;
    patterning the polysilicon layer, the metal nitride barrier layer, the tungsten germanium layer in the PMOS region, the tungsten germanium layer in the NMOS region, the work function adjusting layer, and the gate dielectric layer to form gate structures with different work functions in the NMOS and PMOS regions; and
    forming source/drains on opposite sides of the respective gate structures.

2. The method of claim 1, wherein the metal nitride barrier layer comprises one or more of metal nitrides $M_xN_y$, where M is one of titanium, tantalum, hydrogen fluoride, zirconium, and tungsten.

3. The method of clam 2, wherein the metal nitride barrier layer comprises tantalum nitride or titanium nitride.

4. The method of clam 2, wherein the metal nitride barrier layer is titanium nitride.

5. The method of claim 1, wherein annealing the semiconductor device comprises performing a first anneal at a temperature range of between about 700° C. and 900° C.

6. The method of claim 5, wherein the first anneal is performed for between about 30 seconds and 120 seconds.

7. The method of claim 1, wherein the work function adjusting material comprises one or more of ruthenium, molybdenum, tungsten, rhodium, palladium, technetium, rhenium, osmium, iridium, platinum, and other p-type dopants.

8. The method of claim 5, wherein annealing the semiconductor device further comprises performing a second anneal that is a spike anneal or a laser anneal, or both.

9. The method of claim 1, wherein depositing a tungsten germanium gate electrode layer above the work function adjusting material in the PMOS region comprises one or more of the following; co-sputtering or physical vapor deposition of WGe; chemical vapor deposition of W reacted with Ge.

10. The method of claim 1, wherein the work function adjusting layer is formed using a technique comprising one or more of the following: physical vapor deposition, chemical vapor deposition, and atomic layer deposition.

11. A method of forming dual metal gate structures in a semiconductor device, the method comprising:
  depositing a gate dielectric layer on a semiconductor body;
  depositing or co-sputtering a tungsten germanium gate electrode layer in PMOS and NMOS regions on the gate dielectric layer;
  providing a work function adjusting material at the gate dielectric layer in the PMOS region;
  annealing the semiconductor device;
  forming a metal nitride barrier layer above the tungsten germanium gate electrode layer ;
  forming a polysilicon layer above the metal nitride barrier layer;
  patterning the polysilicon layer, the metal nitride baffler layer, the tungsten germanium and the gate electrode layer to form gate structures with different work functions in the PMOS and NMOS regions; and
  forming source/drains on opposite sides of the respective gate structures.

12. The method of claim 11, wherein depositing a tungsten germanium gate electrode layer comprises one or more of the following: co-sputtering or physical vapor deposition of WGe; chemical vapor deposition of W reacted with Ge.

13. The method of claim 11, wherein providing the work function adjusting material at the gate dielectric layer in the PMOS region comprises implanting the work function material into the tungsten germanium layer in the PMOS region.

14. The method of claim 11, wherein the metal nitride barrier layer comprises one or more of metal nitrides $M_xN_y$, metal silicon nitrides $M_xSi_ySi_yN_z$, metal aluminum nitrides $M_xAl_yN_z$, and metal aluminum silicon nitrides $M_wAl_xSi_yN_z$, where M is one of Ti, Ta, Hf, Zr, and W.

15. The method of claim 11, wherein the metal nitride is TaN or TiN.

16. The method of claim 11, further comprising performing lightly doped drain extension implants on opposing sides of the respective gate structures.

17. The method of claim 16, further comprising forming sidewalls on opposing sides of the respective gate structures.

18. The method of claim 17, further comprising performing source/drain implants on opposing sides of the respective gate structures.

19. The method of claim 11, further comprising performing back end of line processing.

20. The method of claim 11, wherein providing the work function adjusting material at the gate dielectric layer in the PMOS region comprises forming a work function adjusting material layer on the gate dielectric layer in the PMOS region; and wherein depositing or co-sputtering the tungsten germanium gate electrode layer in the PMOS and NMOS regions on the gate dielectric layer comprises depositing or co-sputtering the tungsten germanium gate electrode layer over the work function adjusting material layer in the PMOS region, and over the gate dielectric layer in the NMOS region.

* * * * *